(12) United States Patent
Kim

(10) Patent No.: US 7,286,021 B2
(45) Date of Patent: Oct. 23, 2007

(54) LOW POWER RANDOM BIT GENERATOR AND RANDOM NUMBER GENERATOR

(75) Inventor: Cheol-Min Kim, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 99 days.

(21) Appl. No.: 11/222,648

(22) Filed: Sep. 9, 2005

(65) Prior Publication Data

US 2006/0049882 A1   Mar. 9, 2006

(30) Foreign Application Priority Data

Sep. 9, 2004   (KR) .................... 10-2004-0072106

(51) Int. Cl.
*H03B 29/00*   (2006.01)
(52) U.S. Cl. ...................... 331/78; 708/250
(58) Field of Classification Search .......... 331/78; 708/250
See application file for complete search history.

(56) References Cited

U.S. PATENT DOCUMENTS

| | | | |
|---|---|---|---|
| 4,395,703 A * | 7/1983 | Piosenka ............... | 341/899 |
| 4,611,183 A * | 9/1986 | Piosenka et al. ....... | 331/78 |
| 5,007,087 A * | 4/1991 | Bernstein et al. ...... | 380/46 |
| 6,362,677 B1 * | 3/2002 | Petrofsky ............. | 327/348 |
| 6,931,425 B2 * | 8/2005 | Xie et al. ............ | 708/250 |

FOREIGN PATENT DOCUMENTS

| | | |
|---|---|---|
| JP | 01175458 | 6/2001 |
| JP | 01344094 | 12/2001 |
| KR | 020008849 | 1/2002 |
| KR | 030027724 | 4/2003 |

OTHER PUBLICATIONS

English Abstract * * * .
Marco Bucci, et al. "A High Speed Oscillator-Based Truly Random Number Source for Cryptographic Applications on a Smart Card IC" pp. 403-409, IEEE Transaction on Computer. vol. 52, No. 4, Apr. 2003.
Craig S. Petrie, et al. "A Noise-Based IC Random Number Generator for Applications in Cryptography" pp. 615-621, IEEE Transaction on Circuits and Systems, Fundamental Theory and Applications, vol. 47, No. 5, May 2000.

* cited by examiner

*Primary Examiner*—Robert Pascal
*Assistant Examiner*—Levi Gannon
(74) *Attorney, Agent, or Firm*—F. Chau & Assoc., LLC

(57) ABSTRACT

Provided is a low power random bit generator utilizing a multiplying digital to analog converter (MDAC) which is used in a switched capacitor amplifying circuit and an analog to digital converter with a pipeline architecture. The low power random bit generator includes: an MDAC, outputting a predetermined analog voltage formed by using a ground voltage, a reference voltage, an initial voltage and a digital signal; a comparator, outputting a direct current (DC) voltage determined by comparing the analog voltage with the ground voltage; and a data storage unit, storing a predetermined digital signal corresponding to the DC voltage, and outputting the digital signal.

11 Claims, 4 Drawing Sheets

LOW POWER RANDOM BIT GENERATOR AND RANDOM NUMBER GENERATOR

CROSS-REFERENCE TO RELATED APPLICATION

This application claims the priority of Korean Patent Application No. 10-2004-0072106, filed on Sep. 9, 2004, in the Korean Intellectual Property Office, the disclosure of which is incorporated by reference herein in its entirety.

BACKGROUND OF THE INVENTION

1. Field of the Invention

The present invention relates to a random number generator, and more particularly, to a low power random bit generator and a random number generator using the random bit generator.

2. Description of the Related Art

As information security becomes increasingly important, random number generators, which produce an encryption key and a decoding key, become more essential for many types of electronic systems.

To be embedded in a mobile system such as a smart card, the random number generator should have a simple configuration and consume little power. In particular, if the random number generator is implemented on a semiconductor chip, the random number generator should be compact.

FIG. 1 is a block diagram of a random number generator using an analog system. The random number generator includes a random bit generator (RBG) 100, a post processor 200, and an output buffer 300.

The RBG 100, which is an analog signal processing unit, generates a predetermined random bit signal by using a noise source.

The post processor 200, which is a digital signal processing unit, receives the random bit signal and performs predetermined digital signal processing on the received random bit signal. As a result of the digital signal processing, the randomness of the random bit is increased. Through digital signal processing, algorithms are digitally processed, such as correction and compression, for the random bit signal.

The random bit signal on which digital processing has been performed is transmitted to the outside through the output buffer 300.

A typical way to generate a random bit signal by using an analog signal is to use white noise that is obtained from a resistor which is not biased at a constant voltage. Since the voltage level of a noise signal is typically extremely low, it is not until the noise signal is amplified by an amplifier with a very high gain that the noise signal can be used.

In general, the amplifier consumes much power, thereby increasing the power consumption of a system and the size of a chip. Moreover, in the amplifier, the power supply rejection ratio (PSRR) is deteriorated due to: a) noise caused by peripheral digital logic circuits operating at high frequencies on a semiconductor chip; b) power supply noise; and c) flicker noise. In other words, the amplifier may output unexpected voltage or current due to various types of noise.

To prevent or reduce as much as possible the influence of the digital circuits operating at high frequencies, the amplifier should be separated from the peripheral circuits. However, the separation of the amplifier from the peripheral circuits cannot be easily implemented and requires a large area. Further, to suppress spike noise from a power supply, a resistor having a large resistance and a capacitor having a large capacitance should be installed on the power supply.

SUMMARY OF THE INVENTION

The present invention provides a low power random bit generator. The present invention also provides a random number generator including a low power random bit generator.

According to an exemplary embodiment of the present invention, there is provided a random bit generator comprising: a multiplying digital to analog converter (MDAC), a comparator, and a data storage unit.

The MDAC outputs a predetermined analog voltage formed by using a ground voltage, a reference voltage, an initial voltage and a digital signal. The comparator outputs a direct current (DC) voltage determined by comparing the analog voltage with the ground voltage. The data storage unit stores a predetermined digital signal corresponding to the DC voltage, and outputs the digital signal.

The MDAC may include: an operational amplifier, of which a first input terminal is connected to the ground voltage, outputting the analog voltage from an output terminal; a first capacitor, of which a first terminal is connected to a second input terminal of the operational amplifier; a second capacitor, of which a first terminal is connected to the second input terminal of the operational amplifier; a first switch, selecting either the reference voltage or the ground voltage, each of which is connected to input terminals of the first switch, and transmitting the selected voltage to an output terminal of the first switch in response to the digital signal; a second switch selecting one of the output terminal of the first switch, the initial voltage and the analog voltage, and transmitting the selection to a second terminal of the first capacitor in response to a first control signal; a third switch selecting either the initial voltage or the ground voltage, and transmitting the selection to a second terminal of the second capacitor in response to a second control signal; and a fourth switch selectively connecting the second input terminal and the output terminal of the operational amplifier in response to a third control signal.

According to another exemplary embodiment of the present invention, there is provided a random number generator comprising a random bit generator and a digital post processor. The random bit generator includes: a multiplying digital to analog converter (MDAC) that generates a random bit by using an initial voltage, a reference voltage, a ground voltage and a digital signal each of which has a predetermined voltage level; a comparator that compares the random bit of the MDAC with the ground voltage; and a data storage unit that stores output data of the comparator and outputs the digital signal. The digital post processor digitally performs an algorithm on the digital signal, such as correction and compression, for the output data.

BRIEF DESCRIPTION OF THE DRAWINGS

The above and other features of the present invention will become more apparent by describing in detail exemplary embodiments thereof with reference to the attached drawings in which.

DETAILED DESCRIPTION OF PREFERRED EMBODIMENTS

The present invention will be described in detail by the use of exemplary embodiments of the invention with reference to the attached drawings.

Figure 1:
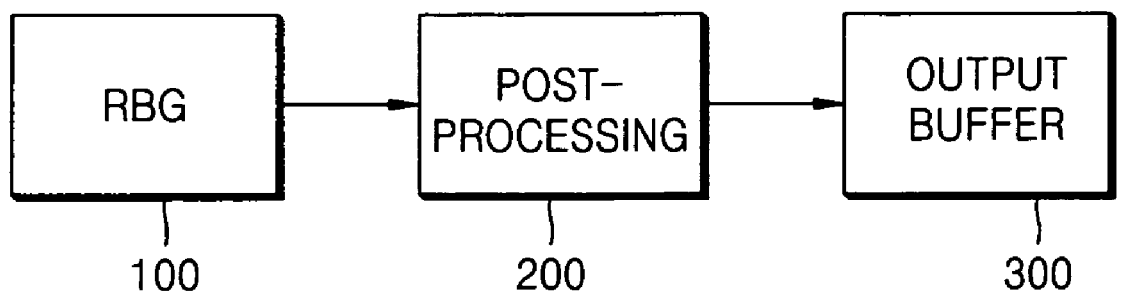
FIG. 1 is a block diagram of a random number generator in an analog system.
Figure 2:
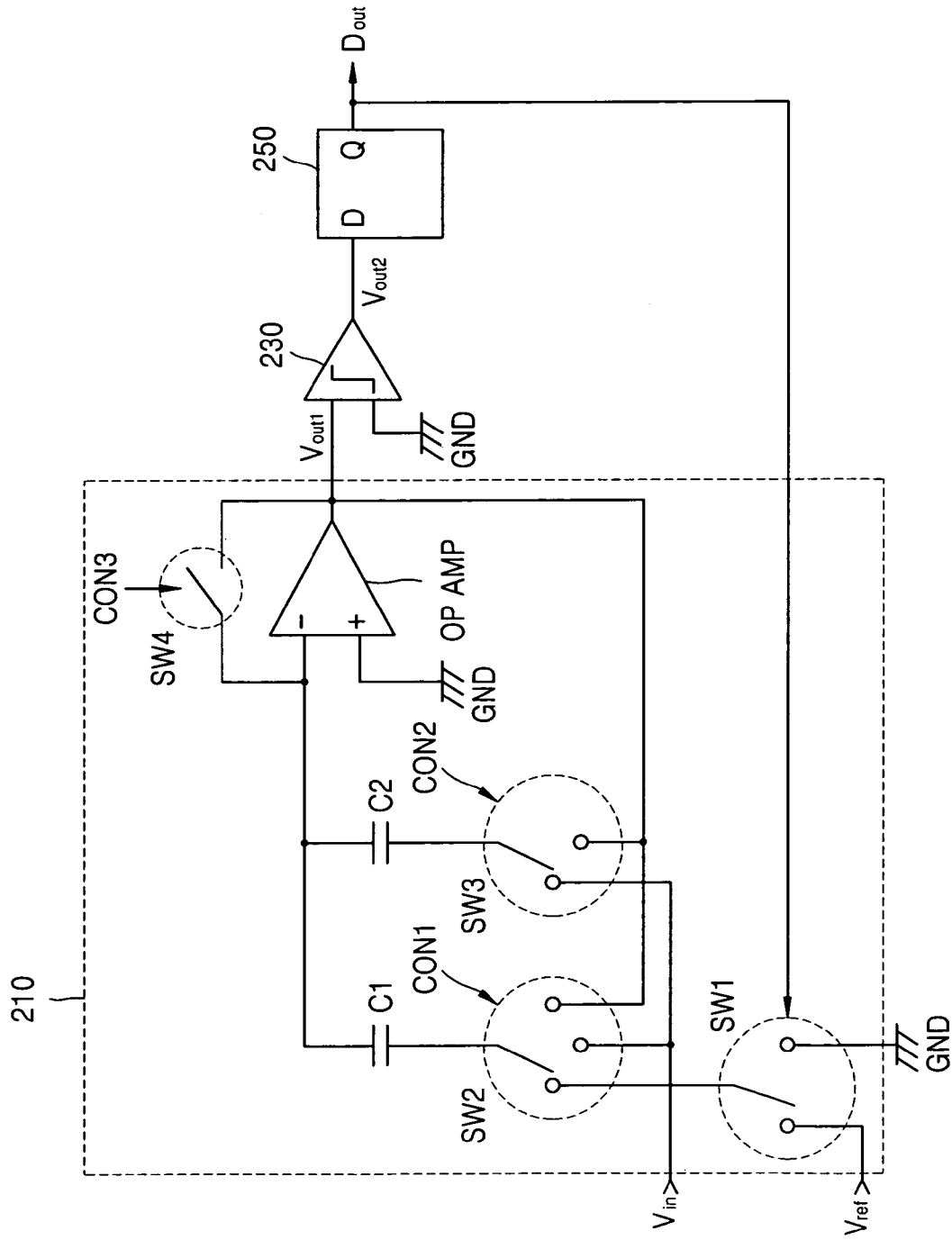
FIG. 2 is a block diagram of a low power random bit generator according to an exemplary embodiment of the present invention.

FIG. 2 is a block diagram of a low power random bit generator according to an exemplary embodiment of the present invention. The random bit generator includes a multiplying digital to analog converter (MDAC) 210, a comparator 230, and a data storage unit 250.

The MDAC 210 outputs a predetermined analog voltage Vout1 which is produced by using a ground voltage GND, a reference voltage Vref, an initial voltage Vin and a digital signal Dout.

The MDAC 210 includes an operational amplifier OP AMP, a first capacitor C1, a second capacitor C2, a first switch SW1, a second switch SW2, a third switch SW3, and a fourth switch SW4.

A positive input terminal (+) of the operational amplifier OP AMP is connected to the ground voltage GND, and an output terminal of the operational amplifier OP AMP outputs the analog voltage Vout1. A negative terminal of the first capacitor C1 is connected to a negative input terminal (−) of the operational amplifier OP AMP. A negative terminal of the second capacitor C2 is also connected to the negative input terminal (−) of the operational amplifier OP AMP. The first switch SW1 selects either the reference voltage Vref or the ground voltage GND, each of which is connected to input terminals of the first switch SW1, and transmits the selected voltage to an output terminal of the first switch SW1 in response to the digital signal Dout. The second switch SW2 selects one of the output terminal of the first switch SW1, the initial voltage Vin and the analog voltage Vout1, and transmits the selection to a positive terminal of the first capacitor C1 in response to a first control signal CON1. The third switch SW3 selects either the initial voltage Vin or the analog voltage Vout1, and transmits the selection to a positive terminal of the second capacitor in response to a second control signal CON2. The fourth switch SW4 selectively connects together the negative input terminal (−) and the output terminal of the operational amplifier OP AMP in response to a third control signal CON3. The terminals are connected together when the fourth switch is turned on (closed position).

The comparator 230 outputs a DC voltage Vout2 determined by comparing the analog voltage Vout1 with the ground voltage GND.

The data storage unit 250 stores a predetermined digital signal corresponding to the DC voltage Vout2, and outputs the digital signal Dout.

The operational amplifier OP AMP may be a general two (2) stage operational amplifier, which is characterized by low power consumption. The 2 stage operational amplifier is an operational amplifier composed of two stages such as a differential input stage and an amplifying stage, or a differential input stage and a buffer stage. The comparator 230 can be implemented by using a 2 stage operational amplifier, hence reducing power consumption.

The data storage unit 250 may be implemented by using a D-type flip-flop.

The random bit generator 210 can operate in two modes: a sample/hold mode and an amplify mode.

In the sample/hold mode, a voltage that has been initially sampled in the MADC 210 is held, and the resulting analog voltage Vout1 is compared with the ground voltage GND by the comparator 230 results in the DC voltage Vout2 which is stored in the data storage unit 250.

Figure 3:
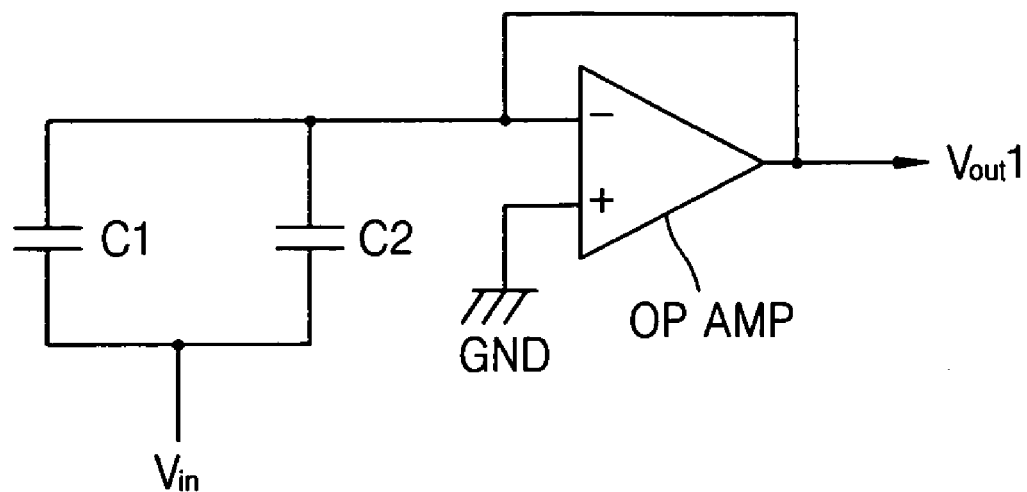
FIG. 3 is a circuit diagram of a multiplying digital to analog converter (MDAC) illustrated in FIG. 2 during a sample/hold mode.

FIG. 3 is a circuit diagram of the MDAC illustrated in FIG. 2 during the sample/hold mode. In the sample/hold mode, the initial voltage Vin connected to the second switch SW2 and the third switch SW3 is selected in response to the first control signal CON1 and the second control signal CON2, respectively. The fourth switch SW4 operating in response to the third control signal CON3 is turned on (closed position). The first switch SW1 operating in response to the digital signal Dout is not used at this moment, and therefore it does not matter which input terminal of the first switch SW1 is selected.

According to the above-described selection operations of the switches, the positive terminals of each capacitor C1 and C2 are provided with the initial voltage Vin, and their negative terminals are connected to the negative input terminal (−) of the operational amplifier OP AMP. The negative input terminal (−) and the output terminal of the operational amplifier OP AMP are connected together, and the positive input terminal (+) of the operational amplifier OP AMP remains connected to the ground voltage GND. Since the operational amplifier OP AMP operates like a buffer, the negative input terminal (−) of the operational amplifier OP AMP becomes a virtual ground having a voltage level of the ground voltage GND. Assuming that each capacitor C1 and C2 has equal capacitance C, the respective capacitors C1 and C2 are charged with charges of C*Vin. The two capacitors C1 and C2 are connected in parallel between the initial voltage Vin and the virtual ground, thus the total amount of charge between the initial voltage Vin and the virtual ground is 2*C*Vin.

In the amplify mode, the charges stored during the sample/hold mode are amplified.

Figure 4:
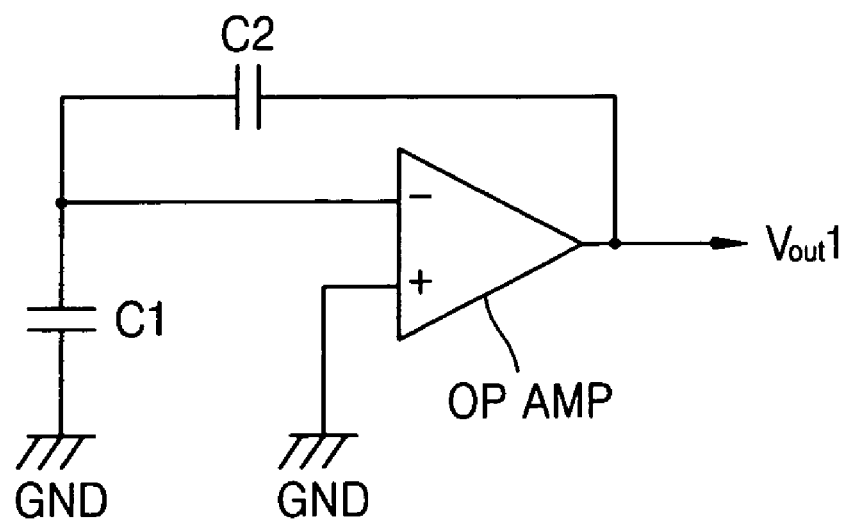
FIG. 4 is a circuit diagram of the MDAC illustrated in FIG. 2 during an amplify mode.

FIG. 4 is a circuit diagram of the MDAC illustrated in FIG. 2 during the amplify mode. The data storage unit 250 is reset to a logic low ("0") during a first cycle. The first switch SW1 selects the ground voltage GND in response to the output of the digital signal Dout. In the amplify mode, the second switch SW2 selects the output of the first switch SW1. Thus, the positive terminal of the first capacitor C1 is connected to the ground voltage GND and the negative terminal of the first capacitor C1 remains connected to the negative input terminal (−) of the operational amplifier OP AMP. The third switch SW3 selects the output terminal of the operational amplifier OP AMP in response to the second control signal CON2. Thus, the positive terminal of the second capacitor C2 is connected to the output terminal of the operational amplifier OP AMP and the negative terminal of the second capacitor C2 also remains connected to the negative input terminal (−) of the operational amplifier OP AMP. The fourth switch SW4 operating in response to the third control signal CON3 is turned off (open position).

During the amplify mode illustrated in FIG. 4, the MDAC 210 is set in a two-step switching operation. First, the negative terminals of the first and second capacitors C1 and C2 remain connected to the negative input terminal (−) of the operational amplifier OP AMP and the positive terminal of the second capacitor C2 is connected to the output terminal of the operational amplifier OP AMP by the third switch SW3 operating in response to the second control signal CON2. At first, the second switch SW2 maintains the previous selection, in this case connecting the positive terminal of the first capacitor C1 with the initial voltage Vin. After a predetermined time, the third switch SW3 remains unchanged and the second switch SW2 selects the ground voltage GND in response to the first control signal CON1, thus connecting the positive terminal of the first capacitor C1 to the ground voltage GND.

Figure 5A:
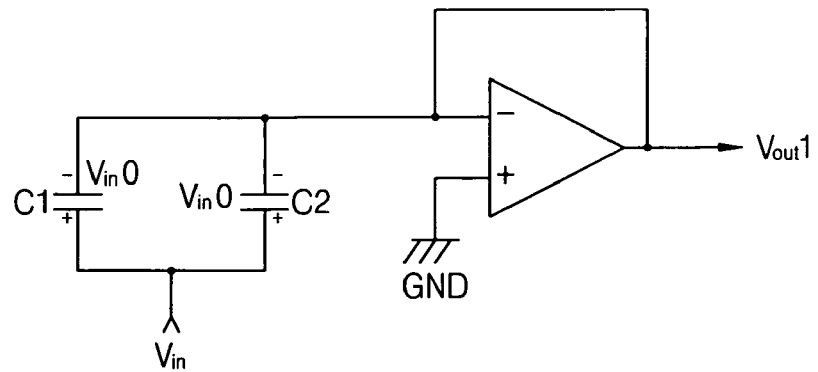
FIG. 5A is a circuit diagram of the MDAC illustrated in FIG. 2 during a sample/hold mode.
Figure 5B:
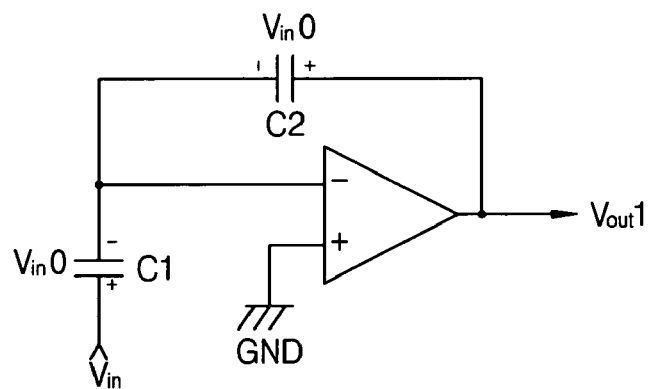
FIG. 5B is a circuit diagram of the MDAC illustrated in FIG. 2 during a first step of the amplify mode.
Figure 5C:
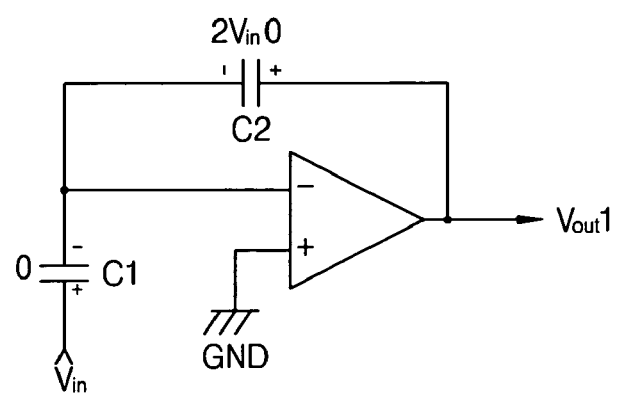
FIG. 5C is a circuit diagram of the MDAC illustrated in FIG. 2 during a second step of the amplify mode.

FIGS. 5A through 5C are circuit diagrams illustrating procedures when the MDAC illustrated in FIG. 2 transits from the sample/hold mode illustrated in FIG. 3 to the amplify mode illustrated in FIG. 4.

FIG. 5a is a circuit diagram of the MDAC illustrated in FIG. 2 during the sample/hold mode.

FIG. 5b is a circuit diagram of the MDAC illustrated in FIG. 2 during a first step of the amplify mode.

FIG. 5C is a circuit diagram of the MDAC illustrated in FIG. 2 during a second step of the amplify mode.

For convenience of description, it is assumed that the two capacitors C1 and C2 illustrated in FIG. 2 have equal capacitance and the initial voltage Vin has a higher voltage level than the ground voltage GND.

Referring to FIG. 5A, at the moment of sampling the positive terminals of the first and second capacitors C1 and C2, which are connected to the initial voltage Vin, will be charged with positive charges, and the negative terminals of the first and second capacitors C1 and C2 will be charged with negative charges.

Referring to FIG. 5B, during the first step of the amplify mode, the positive terminal of the second capacitor C2 connects to the output terminal of the operational amplifier OP AMP and the negative terminal of the second capacitor C2 remains connected to the negative input terminal (−) of the operational amplifier OP AMP.

Since the negative input terminal (−) of the operational amplifier OP AMP has a voltage level equal to the ground voltage GND, the output terminal Vout has a voltage level equal to the initial voltage Vin.

Referring to FIG. 5C, in the second step of the amplify mode, since the positive terminal of the first capacitor C1 is switched from the initial voltage Vin to the ground voltage GND, the positive terminal of the first capacitor C1 has a voltage level equal to the ground voltage GND. At this moment the charge on the negative terminal of the first capacitor C1 is preserved according to the energy conservation law, and the negative charge on the negative terminal of the first capacitor C1 moves to the second capacitor C2. Accordingly, the analog voltage Vout1 of the output terminal of the operational amplifier OP AMP becomes 2*Vin. The initial voltage Vin is amplified two times through the transition from the sample/hold mode to the amplify mode.

When the transition from the sample/hold mode to the amplify mode is considered as a single cycle, the cycle described above corresponds to a first cycle of the circuit operation. A second cycle of an exemplary embodiment of the present invention will be described below.

When the first cycle is completed, a predetermined digital signal Dout has been stored in the data storage unit 250.

In an exemplary embodiment of the present invention, when the digital signal Dout is a logic high ("1"), the first switch SW1 connects to the reference voltage Vref and the analog voltage Vout1 of the MDAC 210 can be denoted by equation 1.

$$Vout1 = 2Vin - Vref \quad (1)$$

When the digital signal Dout is a logic low ("0"), the first switch SW1 connects to the ground voltage GND and the analog voltage Vout1 of the MDAC 210 can be denoted by equation 2.

$$Vout1 = 2Vin \quad (2)$$

In an exemplary embodiment of the present invention, the initial voltage Vin which was used to perform sampling during the sample/hold mode in the first cycle is not used in the second cycle, but a feedback loop is employed in which the analog voltage Vout1, the ground voltage GND and the reference voltage Vref, that were produced in the previous cycle, are used as the input signals to the positive terminal of the first capacitor C1. The first switch SW1 operating in response to the digital signal Dout is not used during the sample/hold mode in the first cycle, but is used during the sample/hold mode in following cycles.

During the sample/hold mode in following cycles of an exemplary embodiment, the second switch SW2 selects one of the output of the first switch SW1 and the analog output Vout1 as randomly determined by the first control signal CON1. Accordingly, the first capacitor C1 and the second capacitor C2 can be discharged when the second switch SW2 and the third switch SW3 both select the analog voltage Vout1 and the fourth switch SW4 is selectively turned on (closed). Alternatively, during the sample/hold mode in following cycles, the second capacitor C2 can be discharged while the first capacitor C1 can be charged to either the ground voltage GND or the reference voltage Vref based on the Dout selection to the first switch SW1 where in this case the second switch SW2 selects the output of the first switch SW1, the third switch SW3 selects the analog voltage Vout1, and the fourth switch SW4 is selectively turned on (closed).

By repeating these cycles, the MDAC can randomly generate an analog voltage Vout1. The analog voltage Vout1 is used in a comparator or a data storage unit, and a low power random bit generator and a random number generator using the random bit generator can be made.

As described above, the random bit generator and the random number generator using the random bit generator can be implemented by using the capacitors, the switches, and the operational amplifier with a simple structure, thereby consuming less power and minimizing the area occupied by the random number generator when implemented on a semiconductor chip.

In another exemplary embodiment of the present invention, a random number generator uses a random bit generator as described above and a digital post processor that digitally performs an algorithm, such as correction and compression, on the random bit output data. The algorithms performed by the digital post processor, such as correction and compression, are known in the art and will not be described.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A random bit generator comprising:
   a multiplying digital to analog converter (MDAC), outputting a predetermined analog voltage formed by using a ground voltage, a reference voltage, an initial voltage and a digital signal;

a comparator, outputting a direct current (DC) voltage determined by comparing the analog voltage with the ground voltage; and a data storage unit, storing a predetermined digital signal corresponding to the DC voltage, and outputting the digital signal, wherein the MDAC includes an operational amplifier, of which a first input terminal is connected to the ground voltage, and a second input terminal is connected to a signal based on at least one of ground voltage, the reference voltage, the initial voltage and the analog voltage.

2. The random bit generator of claim 1, wherein the MDAC further includes:

a first capacitor, of which a first terminal is connected to a second input terminal of the operational amplifier;

a second capacitor, of which a first terminal is connected to the second input terminal of the operational amplifier;

a first switch, selecting the ground voltage during a first cycle and selecting either the reference voltage or the ground voltage in following cycles, each of which is connected to input terminals of the first switch, and transmitting the selected voltage to an output terminal of the first switch in response to the digital signal;

a second switch, selecting one of the output terminal of the first switch, the initial voltage and the analog voltage, and transmitting the selection to a second terminal of the first capacitor in response to a first control signal;

a third switch, selecting either the initial voltage or the analog voltage, and transmitting the selection to a second terminal of the second capacitor in response to a second control signal; and a fourth switch, selectively connecting together the second input terminal and the output terminal of the operational amplifier in response to a third control signal.

3. The random bit generator of claim 2, wherein the random bit generator operates during a sample/hold mode and an amplify mode which are considered to be a single cycle, and during a first cycle, the random bit generator performs sampling by using the initial voltage, and after the first cycle, the random bit generator performs sampling by feeding back the analog voltage.

4. The random bit generator of claim 3, wherein during the sample/hold mode, the first control signal controls the initial voltage to be selected during the first cycle, and controls either the output terminal of the first switch or the analog voltage to be randomly selected in following cycles, the second control signal controls the initial voltage to be selected during the first cycle, and controls the analog voltage to be selected in following cycles, and the third control signal selectively controls the fourth switch to be closed.

5. The random bit generator of claim 4, wherein the amplify mode operates in two steps, wherein during a first step, the first control signal keeps a state selected in the sample/hold mode, the second control signal controls the analog voltage to be selected and the third control signal controls the fourth switch to be open, and wherein during a second step, the first control signal controls the output terminal of the first switch to be selected where the digital signal controls either the ground voltage or the reference voltage to be selected, the second control signal keeps the analog voltage selected and the third control signal keeps the fourth switch open.

6. A random number generator comprising:

a random bit generator, including a multiplying digital to analog converter (MDAC) that generates a random bit by using an initial voltage, a reference voltage, a ground voltage and a digital signal each of which has a predetermined voltage level, a comparator that compares the random bit of the MDAC with the ground voltage, and a data storage unit that stores output data of the comparator and outputs the digital signal; and a digital post processor, digitally performing an algorithm on the digital signal, such as correction and compression, for the output data, wherein the MDAC includes an operational amplifier, of which a first input terminal is connected to the ground voltage, and a second input terminal is connected to a signal based on at least one of the ground voltage, the reference voltage, the initial voltage, and the analog voltage.

7. The random number generator of claim 6, wherein the MDAC further includes:

a first capacitor, of which a first terminal is connected to a second input terminal of the operational amplifier;

a second capacitor, of which a first terminal is connected to the second input terminal of the operational amplifier;

a first switch, selecting the ground voltage during a first cycle and selecting either the reference voltage or the ground voltage in following cycles, each of which is connected to input terminals of the first switch, and transmitting the selected voltage to an output terminal of the first switch in response to the digital signal;

a second switch, selecting one of the output terminal of the first switch, the initial voltage and the analog voltage, and transmitting the selection to a second terminal of the first capacitor in response to a first control signal;

a third switch, selecting either the initial voltage or the ground voltage, and transmitting the selection to a second terminal of the second capacitor in response to a second control signal; and a fourth switch, selectively connecting together the second input terminal and the output terminal of the operational amplifier in response to a third control signal.

8. The random number generator of claim 7, wherein the random bit generator operates during a sample/hold mode and an amplify mode which are considered as a signal cycle, and during a first cycle, the random bit generator performs sampling by using the initial voltage, and after the first cycle, the random bit generator performs sampling by feeding back the analog voltage.

9. The random number generator of claim 8, wherein during the sample/hold mode,
the first control signal controls the initial voltage to be selected during the first cycle, and controls either the output terminal of the first switch or the analog voltage to be randomly selected in following cycles,
the second control signal controls the initial voltage to be selected during the first cycle, and controls the analog voltage to be selected in following cycles, and
the third control signal controls the fourth switch to be closed.

10. The random number generator of claim 8, wherein the amplify mode operates in two steps,
wherein during first step,
the first control signal keeps a state selected in the sample/hold mode,
the second control signal controls the analog voltage to be selected and
the third control signal controls the fourth switch to be open, and
wherein during a second step,
the first control signal controls the output terminal of the first switch to be selected where the digital signal controls either the ground voltage or the reference voltage to be selected, the second control signal keeps the analog voltage selected and
the third control signal keeps the fourth switch open.

11. The random number generator of claim 6, further comprising:
an output buffer outputting the output data of the post processor by buffering the output data.

* * * * *